United States Patent
Kim et al.

(10) Patent No.: US 12,082,440 B2
(45) Date of Patent: Sep. 3, 2024

(54) DISPLAY APPARATUS INCLUDING PLURALITY OF SUBPIXELS WITH LIGHT EMISSION AREA

(71) Applicant: LG Display Co., Ltd., Seoul (KR)

(72) Inventors: Jintae Kim, Paju-si (KR); Sookang Kim, Paju-si (KR); Mingeun Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 405 days.

(21) Appl. No.: 17/501,703

(22) Filed: Oct. 14, 2021

(65) Prior Publication Data

US 2022/0140291 A1    May 5, 2022

(30) Foreign Application Priority Data

Nov. 5, 2020   (KR) .................. 10-2020-0146531

(51) Int. Cl.
| | | |
|---|---|---|
| *H10K 50/858* | (2023.01) | |
| *H10K 59/122* | (2023.01) | |
| *H10K 59/124* | (2023.01) | |
| *H10K 59/126* | (2023.01) | |
| *H10K 59/38*  | (2023.01) | |

(52) U.S. Cl.
CPC ......... *H10K 50/858* (2023.02); *H10K 59/122* (2023.02); *H10K 59/124* (2023.02); *H10K 59/126* (2023.02); *H10K 59/38* (2023.02)

(58) Field of Classification Search
CPC .... H10K 59/122; H10K 59/351; H10K 50/85; H10K 59/38
See application file for complete search history.

(56) References Cited

U.S. PATENT DOCUMENTS

| | | | | |
|---|---|---|---|---|
| 2010/0060148 | A1* | 3/2010 | Hwang | H10K 50/854 257/E21.532 |
| 2014/0346449 | A1* | 11/2014 | Choi | H10K 50/854 438/23 |
| 2015/0206928 | A1* | 7/2015 | Kimura | H10K 59/124 257/88 |
| 2017/0005286 | A1* | 1/2017 | Yun | H10K 59/80521 |
| 2022/0122956 | A1* | 4/2022 | Yun | H01L 33/44 |

FOREIGN PATENT DOCUMENTS

KR   10-2017-0005248 A    1/2017

\* cited by examiner

*Primary Examiner* — Nduka E Ojeh
(74) *Attorney, Agent, or Firm* — Morgan, Lewis & Bockius LLP

(57) ABSTRACT

Disclosed is a display apparatus including a plurality of subpixels configured to include a light emission area, a planarization layer configured to include a plurality of light extraction patterns having a plurality of concave portions and protruding portions in each of the subpixels, a light emitting device layer at the planarization layer of each of the subpixels, and a bank layer disposed between the planarization layer and the light emitting device layer to open the light emission area in each of the plurality of subpixels, an end of the bank layer is disposed at the concave portion of the outermost light extraction pattern of at least one of the subpixels.

12 Claims, 14 Drawing Sheets

DISPLAY APPARATUS INCLUDING PLURALITY OF SUBPIXELS WITH LIGHT EMISSION AREA

CROSS-REFERENCE TO RELATED APPLICATIONS

This application claims the benefit of the Korean Patent Application No. 10-2020-0146531 filed on Nov. 5, 2020, which are hereby incorporated by reference as if fully set forth herein.

BACKGROUND

Technical Field

The present disclosure relates to a display apparatus, and more particularly, to a display apparatus capable of enhancing a light extraction efficiency.

Discussion of the Related Art

With the advancement of an information-oriented society, attentions and requirements for a display apparatus configured to display information have been increased in various types. A display field has been developed rapidly, whereby various light and thin flat display apparatuses have been studied and developed. Recently, various display apparatuses such as a liquid crystal display apparatus and an organic light emitting display apparatus have been utilized.

The organic light emitting display apparatus is a self-emitting display apparatus, and the organic light emitting display apparatus displays an image at a display panel by a light emitting of an organic emitting layer interposed between two electrodes. Thus, unlike the liquid crystal display apparatus, the organic light emitting display apparatus may be fabricated at a lightweight and slim size as it does not need an additional light source. Also, the organic light emitting display apparatus is favorable in view of power consumption due to low voltage driving, and is excellent for color realization, a response speed, a viewing angle, and a contrast ratio, whereby the organic light emitting display apparatus has been studied as a display for next generation.

The organic light emitting display apparatus displays an image while an internal light is emitted to the outside of the display apparatus. Thus, studies for improving an efficiency of the internal light have been made.

SUMMARY

In an organic light emitting display apparatus, light emitted from an organic light emitting layer passes through various components of the organic light emitting display apparatus, and is emitted to the outside of the organic light emitting display apparatus. However, the light emitted from the organic light emitting layer may not be emitted to the outside of the organic light emitting display apparatus, and the light trapped inside the organic light emitting display apparatus exists, so that a light extraction efficiency of the organic light emitting display apparatus is problematic.

Accordingly, embodiments of the present disclosure are directed to a display apparatus that substantially obviates one or more of the problems due to limitations and disadvantages of the related art.

An aspect of the present disclosure is to provide a display apparatus capable of enhancing a light extraction efficiency without an additional process or structure.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus comprises a plurality of subpixels configured to include a light emission area, a planarization layer configured to include a plurality of light extraction patterns having a plurality of concave portions and a plurality of protruding portions in each of the plurality of subpixels, a light emitting device layer disposed at the planarization layer of each of the plurality of subpixels, and a bank layer disposed between the planarization layer and the light emitting device layer to open the light emission area in each of the plurality of subpixels, an end of the bank layer is configured to be disposed at the concave portion of the outermost light extraction pattern of at least one of the plurality of subpixels.

In another aspect, a display apparatus comprises a plurality of subpixels including a light emission area, a planarization layer configured to include a plurality of light extraction patterns having a plurality of concave portions and a plurality of protruding portions in each of the plurality of subpixels, a light emitting device layer disposed at the planarization layer of each of the plurality of subpixels, and a bank layer configured to define the light emission area in each of the plurality of subpixels, an end of the bank layer is configured to be disposed at the concave portion of the outermost light extraction pattern of at least one of the plurality of subpixels.

According to an embodiment of the present disclosure, the end of the bank layer configured to be overlapped with all the concave portions of all the outermost light extraction patterns among the plurality of light extraction patterns.

According to an embodiment of the present disclosure, the plurality of subpixels is configured to include a red subpixel, a white subpixel, a blue subpixel, and a green subpixel, the end of the bank layer in each of the red subpixel, the white subpixel, the blue subpixel, and the green subpixel is configured to be disposed at the concave portion of the outermost light extraction pattern.

According to an embodiment of the present disclosure, the end of the bank layer in each of the red subpixel, the blue subpixel, and the green subpixel is configured to be alternately disposed at the concave portion and the protruding portion of the outermost light extraction pattern, and the end of the bank layer in the blue subpixel is configured to be disposed at the concave portion of the outermost light extraction pattern.

According to an embodiment of the present disclosure, the end of the bank layer in each of the red subpixel, the blue subpixel, and the green subpixel is configured to be disposed at the concave portion of the outermost light extraction pattern, and the end of the bank layer in the white subpixel is configured to be disposed at the protruding portion of the outermost light extraction pattern. The end of the bank layer in the white subpixel is configured to be disposed between the outermost light extraction pattern and the light extraction pattern adjacent to the outermost light extraction pattern.

According to the embodiments of the present disclosure, the display apparatus is advantageous that a luminance and a color temperature of a display image may be improved.

According to the embodiments of the present disclosure, an end of the bank layer is disposed to be positioned at the concave portion of the outermost light extraction pattern, and thus, the light emission area may be widened to increase an aperture ratio, thereby improving a luminance.

According to the embodiments of the present disclosure, an end of the bank layer is disposed to be positioned at the concave portion of the outermost light extraction pattern, and the inclined surface of the light extraction pattern is exposed, whereby the light emitted from the light emitting device layer may be reflected by the second electrode disposed at the inclined surface without being trapped by the bank layer or the protruding portion of the light extraction pattern, and may be extracted forward, thereby improving a light extraction efficiency.

According to the embodiments of the present disclosure, an end of the bank layer in the white subpixel is disposed at protruding portions of all the outermost light extraction pattern, or disposed every between the concave portion of the outermost light extraction pattern and the concave portion of the light extraction pattern disposed at the previous therein, whereby the reflection visibility of the display apparatus may be lowered by reducing the diffusion components of light.

Also, according to the embodiments of the present disclosure, the light extraction efficiency may be adjusted for each of the subpixels having different color temperatures, and the light extraction efficiency may be improved without additional process or structure.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
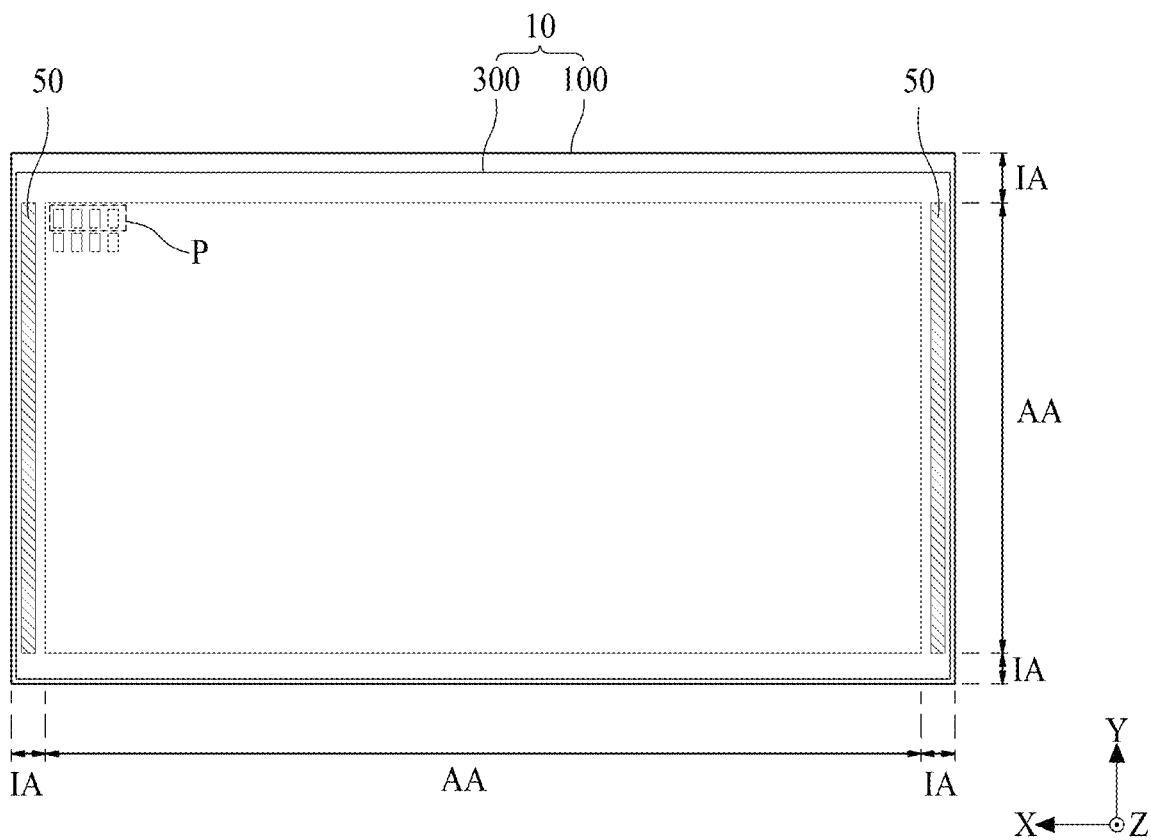
FIG. 1 illustrates a display apparatus according to an embodiment of the present disclosure.

Hereinafter, embodiments of the present disclosure will be described in detail with reference to the drawings. The embodiments introduced below are provided as examples so that the spirit of the present invention can be sufficiently conveyed to those skilled in the art. Accordingly, the present disclosure is not limited to the embodiments described below and may be embodied in other shapes. And in the drawings, a size and a thickness of the device may be exaggerated for convenience. Like reference numerals refer to like elements throughout. Further in the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only' is used. The terms of a singular form may include plural forms unless referred to the contrary.

In describing a positional relationship, for example, when a position relation between two parts is described as 'on', 'over', 'under', and 'next', one or more other parts may be disposed between the two parts unless a more limiting term, such as "just" or "direct(ly)" is used.

Spatially relative terms, such as "below," "beneath," "lower," "above." "upper," and the like, may be used to easily describe the relationship of one element or elements and another element or elements as illustrated in the drawings. Spatially relative terms may be understood as terms including different directions of the device in use or operation, in addition to the direction illustrated in the drawings. For example, when the device in the drawings is turned over, elements described as "below" or "beneath" of other elements may be placed "above" of other elements. Thus, the exemplar term "below" or "beneath" may include both a downward direction and an upward direction.

In describing elements of the present disclosure, the terms "first," "second," "A," "B," "(a)," "(b)," etc. may be used. These terms are intended to identify, the corresponding elements from the other elements, and basis, order, sequence, or number of the corresponding elements should not limit by these terms.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 illustrates a display apparatus according to an embodiment of the present disclosure.

Referring to FIG. 1, the display apparatus (or light emitting display apparatus) according to an embodiment of the present disclosure may include a display panel 10 and a panel external driving circuit part. The display panel 10 may include a substrate 100 and an opposite substrate 300 bonded to each other.

The substrate 100 may include a thin film transistor. The substrates 100 may be a transparent glass substrate or a transparent plastic substrate. The substrate 100 may include a display area AA and a non-display area (IA).

The display area AA may be an area for displaying an image. The display area AA may be a pixel array area, an active area, a pixel array portion, a display portion, or a screen. For example, the display area AA may be disposed at a central area of the display panel 10. The display area AA may include a plurality of pixels P. The plurality of pixels P may be defined as unit areas in which light is actually emitted.

The non-display area (IA) may be an area in which an image is not displayed. The non-display area (IA) may be a peripheral circuit area, a signal supply area, a non-active area, or a bezel area. The non-display area (IA) may be configured to surround the display area AA. The display panel 10 or the substrate 100 may further include a peripheral circuit portion 50 disposed at the non-display area (IA). The opposite substrate 300 may correspond to seal the substrate 100.

The opposite substrate 300 may be bonded to the substrate 100 by using an adhesive member (or transparent adhesive). The opposite substrate 300 may be an upper substrate, a second substrate, or an encapsulation substrate.

Additionally, the substrate 100 according to an embodiment of the present disclosure may further include an optical film disposed at a second surface opposite to a first surface. The second surface of the first substrate 100 may be a rear surface of the substrate 100 or a light extraction surface of the substrate 100. For example, the optical film may further include a polarizing film attached to the second surface of the substrate 100.

Figure 2:
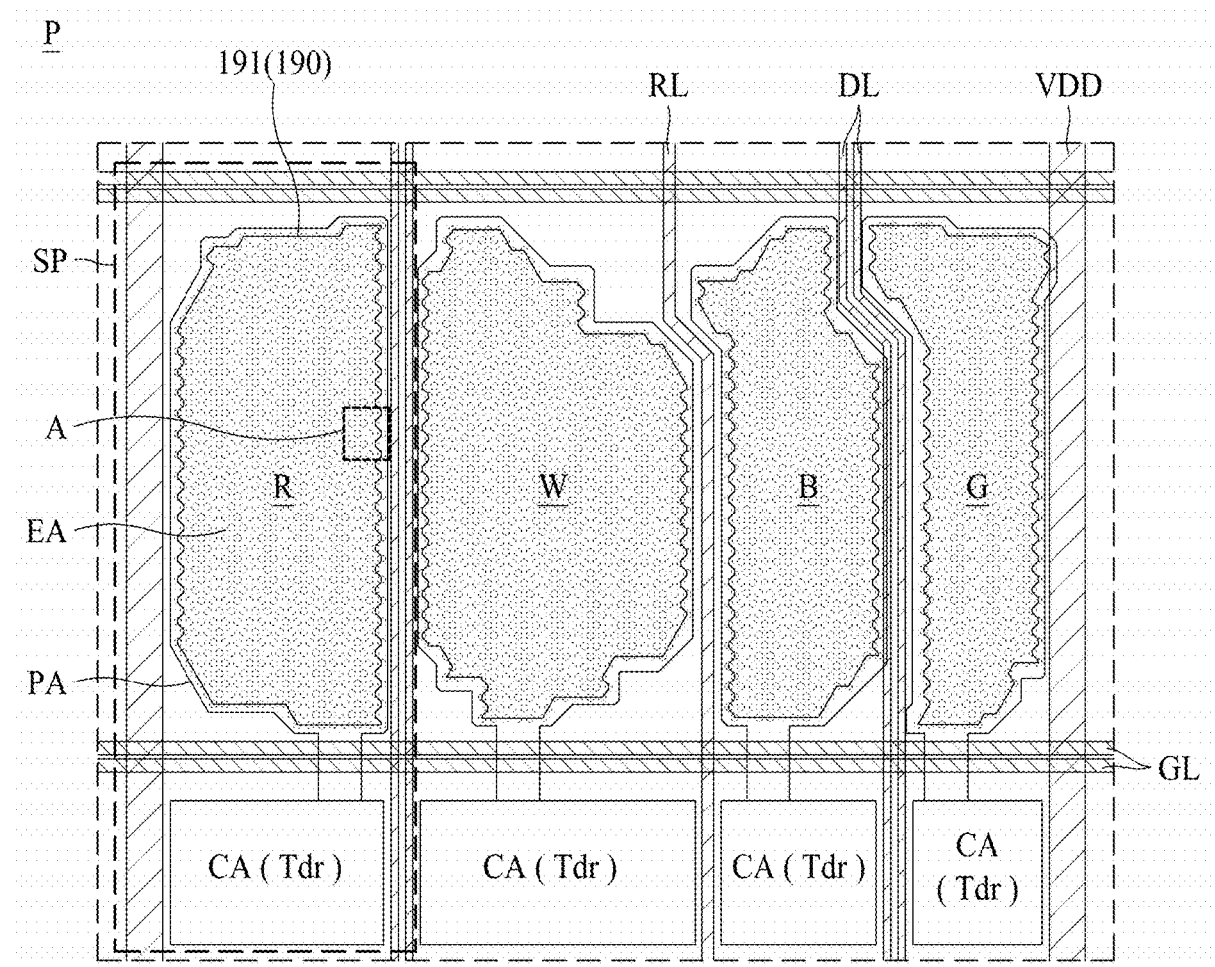
FIG. 2 illustrates a plan structure of one pixel according to an embodiment of the present disclosure.
Figure 3:
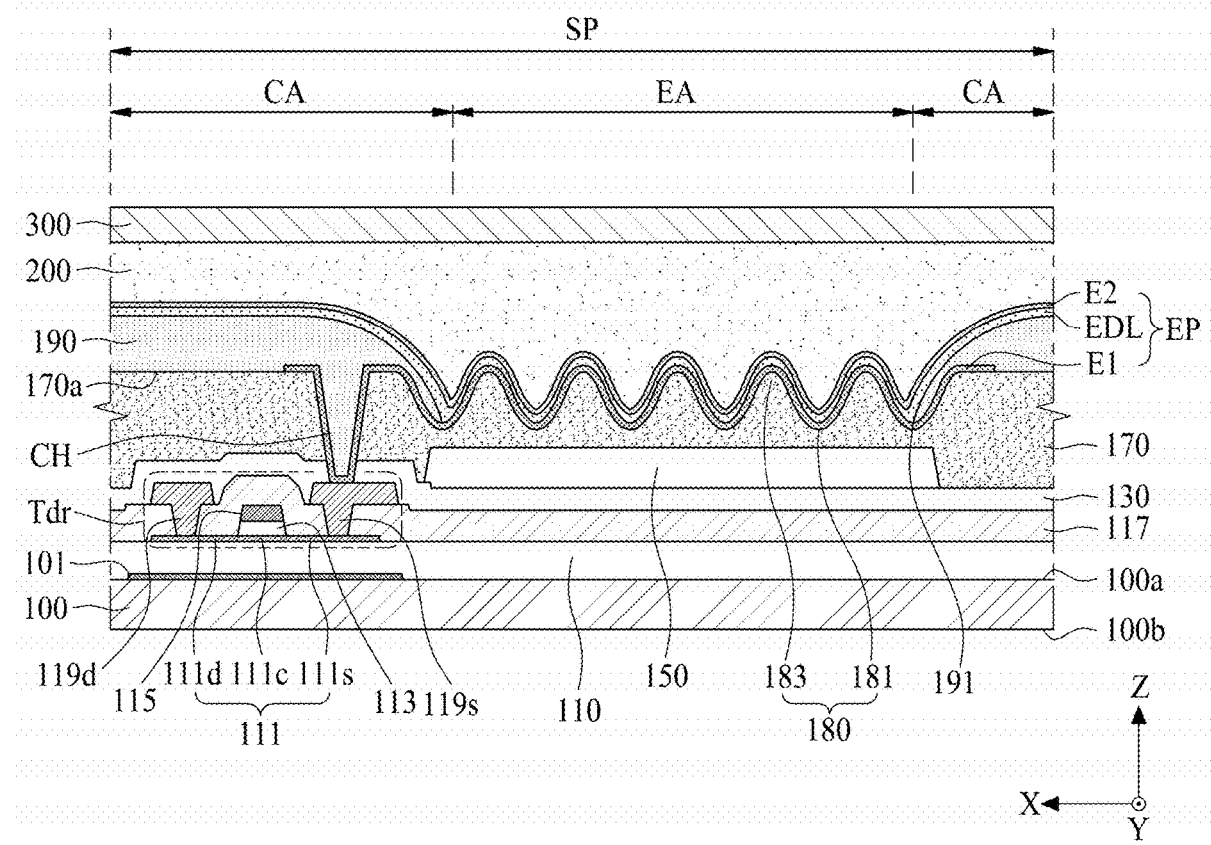
FIG. 3 is a cross-sectional view illustrating a cross-sectional structure of a subpixel of FIG. 2.
Figure 4:
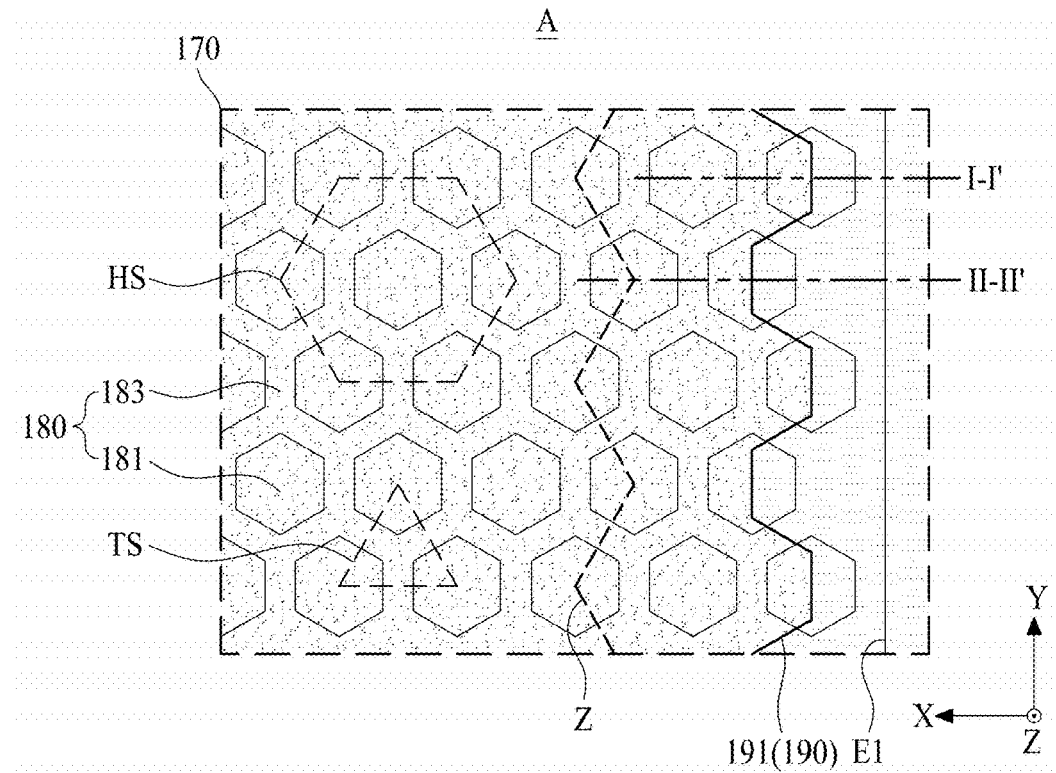
FIG. 4 is an expanded plan view showing 'A' of FIG. 2.

FIG. 2 illustrates a plan structure of one pixel according to an embodiment of the present disclosure. FIG. 3 is a cross-sectional view illustrating a cross-sectional structure of a subpixel of FIG. 2. FIG. 4 is an expanded plan view showing 'A' of FIG. 2.

Referring to FIGS. 2 to 4, the display apparatus according to an embodiment of the present disclosure may include the plurality of pixels P, wherein one unit pixel P may be configured to include a plurality of subpixels SP.

The plurality of subpixels SP may include a red subpixel R, a white subpixel W, a blue subpixel B, and a green subpixel G. The plurality of subpixels SP may be classified (or divided) into a red subpixel R, a white subpixel W, a blue subpixel B, and a green subpixel G. One subpixel SP may include a pixel area PA and a circuit area CA. The pixel area PA may include a light emission area EA. The circuit area CA may be spatially separated from the light emission area EA inside the subpixel SP. The light emission area EA is an area defined as a bank (or a bank layer) in the subpixel SP, for example, an area in which a bank (or a bank layer) is opened. The light emission area EA may be defined as the remaining portions except the circuit area CA. For example, the circuit area CA may be a non-light emission area or a non-opening area.

One pixel P may include the four subpixels SP. The subpixel SP may include a red subpixel R, a white subpixel W, a blue subpixel B, and a green subpixel G. Between the light emission area EA and the circuit area CA in the subpixel SP, there is a traverse gate line GL disposed to be extended. Between each of the subpixels SP, a plurality of data lines DL or reference lines RL may be disposed and configured to traverse an area between corresponding light emission area EA and the adjacent light emission area EA or between corresponding circuit area CA and the adjacent circuit area CA. In one grouped pixel P, there is a power source line VDD parallel to the data line DL. For a sensing driving mode of the pixel P, the reference line RL may be used as a sensing line configured to externally sense a characteristics variation of a driving thin film transistor Tdr and/or a characteristics variation of the light emitting device layer.

The display apparatus may include a buffer layer 110, a pixel circuit portion, a protection layer 130, a planarization layer 170, and a light emitting portion EP over the substrate 100.

The buffer layer 110 may be disposed at an entire area of the first surface (or front surface) 100a of the substrate 100. The buffer layer 110 may prevent materials contained in the substrate 100 from spreading to a transistor layer for a high-temperature step of a process for manufacturing the thin film transistor, or may prevent external water or moisture from being permeated into a light emitting device. Selectively, according to some embodiments of the present disclosure, the buffer layer 110 may be omitted.

The pixel circuit portion may include the driving thin film transistor Tdr disposed at the circuit area CA. The driving thin film transistor Tdr may include an active layer 111, a gate insulating film 113, a gate electrode 115, an insulating interlayer 117, a drain electrode 119d, and a source electrode 119s.

The active layer 111 included in the driving thin film transistor Tdr may be configured as a semiconductor material based on any one of amorphous silicon, polycrystalline silicon, oxide, and organic materials.

The gate insulating film 113 may be provided over a channel region 111c of the active layer 111. As an example, the gate insulating film 113 may be provided at an island shape only over the channel region 111c of the active layer 111, or may be provided over the entire surface of the buffer layer 110 or substrate 100 including the active layer 111.

The insulating interlayer 117 may be provided over the gate electrode 115, and a drain region 111d and a source region 111s of the active layer 111. The insulating interlayer 117 may be provided over the entire areas of the light emission area EA and the circuit area CA. For example, the insulating interlayer 117 may be configured as an inorganic material or an organic material.

The pixel circuit portion may further include a capacitor, and first and second switching thin film transistors disposed at the circuit area CA together with the driving thin film transistor Tdr. The display apparatus may further include a light shielding layer 101 provided below the active layer 111 of at least one of the driving thin film transistor Tdr, the first switching thin film transistor, and the second switching thin film transistor.

The protection layer 130 may be provided over the substrate 100 so as to cover (or overlay) the pixel circuit portion. The protection layer 130 covers (or overlays) the drain electrode 119d of the driving thin film transistor Tdr, the source electrode 119s of the driving thin film transistor Tdr, and the insulating interlayer 117. The protection layer 130 may be provided over the entire area of the pixel area CA and the light emission area EA. For example, the protection layer 130 may be expressed as a passivation layer.

The display apparatus according to an embodiment of the present disclosure may further include a wavelength conversion layer 150 over the substrate 100.

The wavelength conversion layer 150 may be disposed between the substrate 100 and the planarization layer 170 so as to be overlapped with at least one light emission area EA. The wavelength conversion layer 150 according to an embodiment of the present disclosure may be disposed between the protection layer 130 and the planarization layer 170 so as to be overlapped with the light emission area EA. The wavelength conversion layer 150 according to another embodiment of the present disclosure may be disposed between the insulating interlayer 117 and the protection layer 130 or between the substrate 100 and the insulating interlayer 117 so as to be overlapped with the light emission area EA.

The wavelength conversion layer 150 may have a relatively large size than the light emission area EA. For example, the wavelength conversion layer 150 may be relatively larger than the light emission area EA, whereby the wavelength conversion layer 150 may be relatively larger than the light extraction pattern 180 of the planarization layer 170.

The wavelength conversion layer 150 includes a color filter which transmits only the wavelength corresponding to a color in the pixel among the light emitted from the light emitting portion EP toward the substrate 100. For example, the wavelength conversion layer 150 may transmit only the red wavelength, green wavelength, or blue wavelength. In the light emitting display apparatus according to the present disclosure, when one unit pixel P comprises the adjacent first to fourth subpixels SP, the wavelength conversion layer provided in the first subpixel may include a red color filter, the wavelength conversion layer provided in the second subpixel may include a green color filter, and the wavelength conversion layer provided in the third subpixel may include a blue color filter. In the fourth subpixel, the wavelength conversion layer is not provided so that white colored light may be emitted therefrom.

The planarization layer 170 may be provided over the substrate 100 so as to cover (or overlay) the protection layer 130. When the protection layer 130 is omitted, the planarization layer 170 may be provided over the substrate 100 so as to cover (or overlay) the pixel circuit portion. The planarization layer 170 may be provided over the entire areas of the circuit area CA and the light emission area EA. Also, the planarization layer 170 may be provided over the entire display area and the remaining portions among the non-display area except a pad area. For example, the planarization layer 170 may include an extending portion (or expanding portion) extended or expanded from the display area to the remaining portions of the non-display area except the pad area. Accordingly, the planarization layer 170 may have a relatively large size than the display area.

The planarization layer 170 according to an embodiment of the present disclosure is configured to have a relatively large thickness so that the planarization layer 170 may provide a planarized surface over the display area AA. For example, the planarization layer 170 may be formed of an organic material such as photo acrylic, benzocyclobutene, polyimide, fluorine resin or the like.

The planarization layer 170 may include the light extraction pattern 180 disposed at the pixel area PA. The light extraction pattern 180 may be provided over an upper surface 170a of the planarization layer 170 so as to be overlapped with the light emission area EA of the pixel area PA. The light extraction pattern 180 is provided over the planarization layer 170 of the light emission area EA to have a curved (or uneven) shape, whereby a progress path of light emitted from the light emitting device layer EDL is changed to increase light extraction efficiency of the pixel P. The light extraction pattern 180 may be disposed by connecting a plurality of lens shapes whose protruding surfaces face toward the substrate 100. For example, the light extraction pattern 180 may include a plurality of convex lenses facing the substrate 100. The light extraction pattern 180 may have a relatively large size than the light emission area EA of the subpixel SP. For example, the light extraction pattern 180 may be an uneven pattern portion, a micro lens, or a light scattering pattern.

The light emitting portion EP is disposed at the light extraction pattern 180 of the light emission area EA, and the light emitting portion EP may emit the light toward the substrate 100 in accordance with a bottom emission type. The light emitting portion EP according to an embodiment of the present disclosure may include a first electrode E1, a light emitting device layer EDL, and a second electrode E2.

The first electrode E1 is provided over the planarization layer 170 of the pixel area PA and may be electrically connected with the source electrode 119s of the driving thin film transistor Tdr. One end of the first electrode E1 which is close to the circuit area CA may be electrically connected to the source electrode 119s of the driving thin film transistor Tdr via an electrode contact hole CH provided in the planarization layer 170 and the protection layer 130.

The first electrode E1 directly contacts the light extraction pattern 180, whereby the first electrode E1 has a shape corresponding to the light extraction pattern 180. As the first electrode E1 is provided (or deposited) over the planarization layer 170, and is configured to have a relatively small thickness, the first electrode E1 may have a surface morphology (or second surface shape) which conforms to a surface morphology (or first surface shape) of the light extraction pattern 180 including a protruding portion 183 and a plurality of concave portions 181. For example, the first electrode E1 is formed in a conformal shape based on the surface shape (morphology) of the light extraction pattern 180 by a deposition process of a transparent conductive material, whereby the first electrode E1 may have a cross-sectional structure whose shape is the same as the light extraction pattern 180.

The light emitting device layer EDL is provided over the first electrode E1 and may directly contact the first electrode E1. As the light emitting device layer EDL is provided (or deposited) over the first electrode E1, and is configured to have a relatively large thickness than the first electrode E1, the light emitting device layer EDL may have a surface morphology (or third surface shape) which is different from the surface morphology in each of the protruding portion 183 and the plurality of concave portions 181 or the surface morphology of the first electrode E1. For example, the light emitting device layer EDL is formed in a non-conformal shape which does not conform to the surface shape (or morphology) of the first electrode E1 by a deposition process, whereby the light emitting device layer EDL may have a cross-sectional structure whose shape is different from the first electrode E1.

The light emitting device layer EDL according to an embodiment of the present disclosure may be configured to have a gradually-increased thickness toward the bottom surface of the protruding portion 183 or the concave portion 181. For example, the light emitting device layer EDL may be configured to have a first thickness over the top portion of the protruding portion 183, and a second thickness over the bottom surface of the concave portion 181, wherein the second thickness is relatively larger than the first thickness, and a third thickness over the inclined surface (or curved surface) of the protruding portion 183, wherein the third thickness is relatively smaller than the first thickness. Herein, each of the first, second, and third thicknesses may be the shortest distance between the first electrode E1 and the second electrode E2.

The light emitting device layer EDL according to an embodiment of the present disclosure includes two or more light emitting layers for emitting white light. As an example, the light emitting device layer EDL may include a first light emitting layer and a second light emitting layer to emit white light by a mixture of first light and second light. For example, the first light emitting layer may include any one selected among a blue light emitting layer, a green light emitting layer, a red light emitting layer, a yellow light emitting layer, and a yellow-green light emitting layer so as to emit the first light. For example, the second light emitting layer may include a light emitting layer capable of emitting the second light so as to obtain white light in the light emitting portion EP by a mixture with the first light of a blue light emitting layer, a green light emitting layer, a red light emitting layer, a yellow light emitting layer, or a yellow-green light emitting layer. As another embodiment, the light emitting device layer EDL may include any one selected from a blue light emitting layer, a green light emitting layer, and a red light emitting layer.

The second electrode E2 is provided over the light emitting device layer EDL and may directly contact the light emitting device layer EDL. The second electrode E2 may be provided (or deposited) over the light emitting device layer EDL and may be configured to have a relatively small thickness than the light emitting device layer EDL. According as the second electrode E2 is provided (or deposited) over the light emitting device layer EDL, and is configured to have a relatively small thickness than the light emitting device layer EDL, the second electrode E2 may have a surface morphology which conforms to the surface morphology of the light emitting device layer EDL. For example, the second electrode E2 is formed in a conformal shape corresponding to the surface shape (or morphology) of the light emitting device layer EDL by a deposition process, whereby the second electrode E2 may have a cross-sectional structure whose shape is the same as the light emitting device layer EDL.

The second electrode E2 according to an embodiment of the present disclosure may include a metal material having a high reflectance so as to reflect the incident light emitted from the light emitting device layer EDL toward the substrate 100. For example, the second electrode E2 may include a single-layered structure or multi-layered structure of any one material selected from aluminum (Al), argentums (Ag), molybdenum (Mo), aurum (Au), magnesium (Mg), calcium CA, or barium (Ba), or alloy of two or more materials selected from aluminum (Al), argentums (Ag), molybdenum (Mo), aurum (Au), magnesium (Mg), calcium CA, or barium (Ba). The second electrode E2 may include an opaque conductive material having high reflectance.

The light extraction pattern 180 according to an embodiment of the present disclosure may be disposed at the planarization layer 170 overlapped with the light emission area EA of the subpixel SP. The light extraction pattern 180 may include the plurality of concave portions 181, and the protruding portion 183 between the plurality of concave portions 181.

Each of the plurality of concave portions 181 may be concavely provided from an upper surface of the planarization layer 170 to face toward the substrate 100 with respect to the flat surface of the planarization layer 170. Each of the plurality of concave portions 181 may be configured to have the same depth with respect to an upper surface 170a of the planarization layer 170. However, when a patterning process of the light extraction pattern 180 is performed, some of the plurality of concave portions 181 may have different depths.

The display apparatus may further include a bank layer 190 configured to define the light emission area EA.

The bank layer 190 may be disposed at the edge of the first electrode E1 and the planarization layer 170. The bank layer 190 may be overlapped with the edge of the wavelength conversion layer 150. For example, the bank layer 190 may be formed of an organic material such as belzocyclobutene (BCB) based resin, acrylic based resin, or polyimide resin. The bank layer 190 may be formed of a photosensitizer including a black pigment. In this case, the bank layer 190 may also function as a light shielding member between the adjacent pixels.

The bank layer 190 is disposed at the upper surface 170a of the planarization layer 170 and is configured to cover (or overlay) the edge of the first electrode E1 extending onto the circuit area CA, and is also disposed to cover (or overlay) the edge of the light extraction pattern 180. The light emission area EA defined by the bank layer 190 may be formed to have a smaller size than an area of the light extraction pattern 180 of the planarization layer 170.

The light emitting device layer EDL may be formed at the first electrode E1, the bank layer 190, and a step-difference portion between the first electrode E1 and the bank layer 190. In this case, when the light emitting device layer EDL is provided at a thin thickness at the step-difference portion between the first electrode E1 and the bank layer 190, the second electrode E2 and the first electrode E1 may electrically contact (or short-circuit) to each other due to a thickness reduction of the light emitting device layer EDL. In order to prevent this problem, the outermost bank line corresponding to one end 191 of the bank layer 190 is disposed to cover (or overlay) the edge of the light extraction pattern 180 so that it is possible to reduce a step difference between the first electrode E1 and the bank layer 190, to thereby prevent a short (or short-circuit) between the first electrode E1 and the second electrode E2.

Referring to FIG. 4, each of the plurality of concave portions 181 may be disposed at fixed intervals in parallel along the first direction X while being provided so as to have a predetermined gap corresponding to one of the light extraction pattern 180, and may be disposed at a predetermined interval in the second direction Y crossing to the first direction X. For example, the plurality of concave portions 181 may be arranged in a lattice shape having a predetermined interval, and the light extraction patterns 180 adjacent along the second direction Y are staggered with respect to each other, so that the concave portions 181 may be spaced apart from each other in the second direction Y. Therefore, when the adjacent concave portions 181 disposed along the first direction X are connected to each other, the adjacent concave portions 181 may be connected to each other in a straight line. When the adjacent concave portions 181 disposed along the second direction Y may be connected to each other, the adjacent concave portions 181 may be connected to each other in a zigzag line Z. For example, the straight line or zigzag line Z may pass through the center of the adjacent concave portions 181.

The center of each of the three adjacent concave portions 181 may form a triangle shape TS. Also, each of the plurality of concave portions 181 may be surrounded by the adjacently disposed six concave portions 181. In this case, the center of each of the six concave portions 181 surrounding one concave portion 181 may form a hexagonal shape HS in a two-dimensional structure. For example, the plurality of concave portions 181 may be disposed or arranged in a beehive, or honeycomb structure, or a circle structure.

A pitch (or interval) between the plurality of concave portions 181 arranged in each of the plurality of subpixels SP may be the same or different from each other. Herein, a pitch between the concave portions 181 may be a distance (or interval) between central points of the two adjacent concave portions 181.

As an embodiment, a pitch between each of the concave portions 181 disposed in the red subpixel, the green subpixel, and the blue subpixel constituting one unit pixel may be the same or different from each other. For example, a pitch between the concave portions 181 disposed in the green subpixel may be different from a pitch between the concave portions 181 disposed in the blue subpixel, but embodiments of the present disclosure are not limited thereto.

As another embodiment, a pitch between each of the concave portions 181 disposed in the red subpixel, the green subpixel, the blue subpixel, and the white subpixel constituting one unit pixel P may be the same or different from each other. For example, a pitch between the concave portions 181 disposed in the white subpixel and/or green subpixel may be different from a pitch between the concave portions 181 disposed in the red subpixel and/or blue subpixel, but embodiments of the present disclosure are not limited thereto.

The protruding portion 183 may be provided over the planarization layer 170 overlapped with the light emission area EA to have a shape capable of maximizing an external extraction efficiency of light generated in the subpixel SP based on an effective light light emission area of the light emitting portion EP. The protruding portion 183 may increase external extraction efficiency of light emitted from the light emitting portion EP by changing the progress path of the light emitted from the light emitting portion EP toward the substrate 100.

The protruding portion 183 may be implemented to individually surround each of the plurality of concave portions 181. For example, the protruding portion 183 may include a bottom surface (or bottom surface) of each of the plurality of concave portions 181, and an inclined surface inclined from the bottom surface to all directions. Accordingly, the planarization layer 170 overlapped with the light emission area EA may include the plurality of concave portions 181 surrounded by the protruding portion 183. The protruding portion 183 surrounding one concave portion 181 may have a hexagonal shape (or honeycomb shape) in a two-dimensional structure.

The end 191 of the bank layer 190 opening the light emission area EA is positioned inside the first electrode E1 in which the light extraction pattern 180 is disposed with respect to the edge of the first electrode E1, and is positioned at the concave portion 181 of the outermost light extraction pattern 180. The end 191 of the bank layer 190 may be the outermost bank line, or may be the start point which contacts the first electrode E1, or may be the line of the opening area of the bank layer 190 for defining the light emission area EA. The end 191 of the bank layer 190 is configured to have a zigzag shape in a plan view. The end 191 of the bank layer 190 may be disposed to be overlapped with all the concave portions 181 of the outermost light extraction pattern 180 disposed inside the at least one subpixel SP.

Figure 5A:
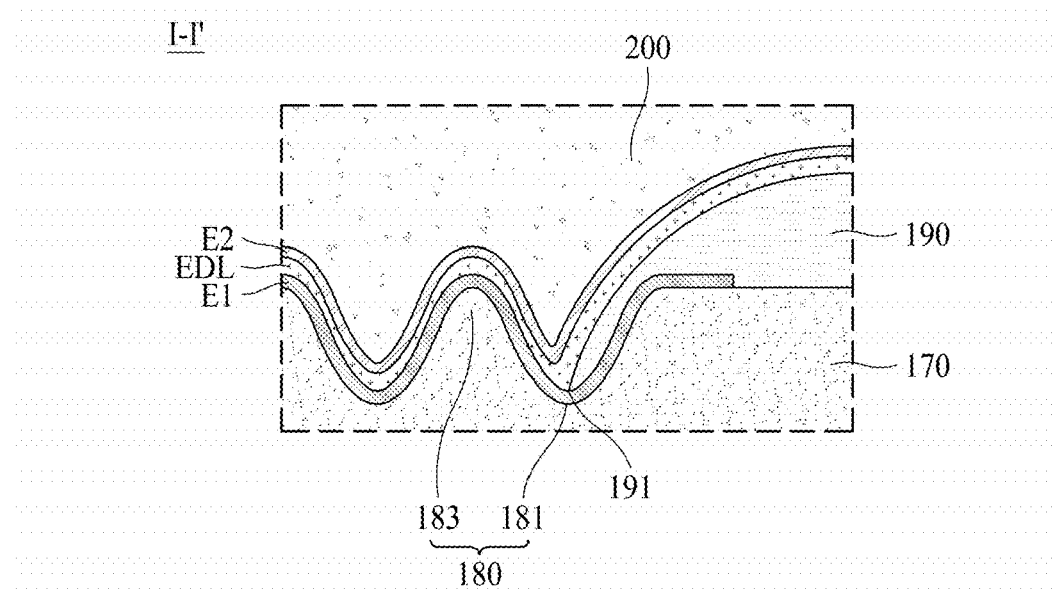
FIG. 5A is a cross-sectional view along I-I' of FIG. 4.
Figure 5B:
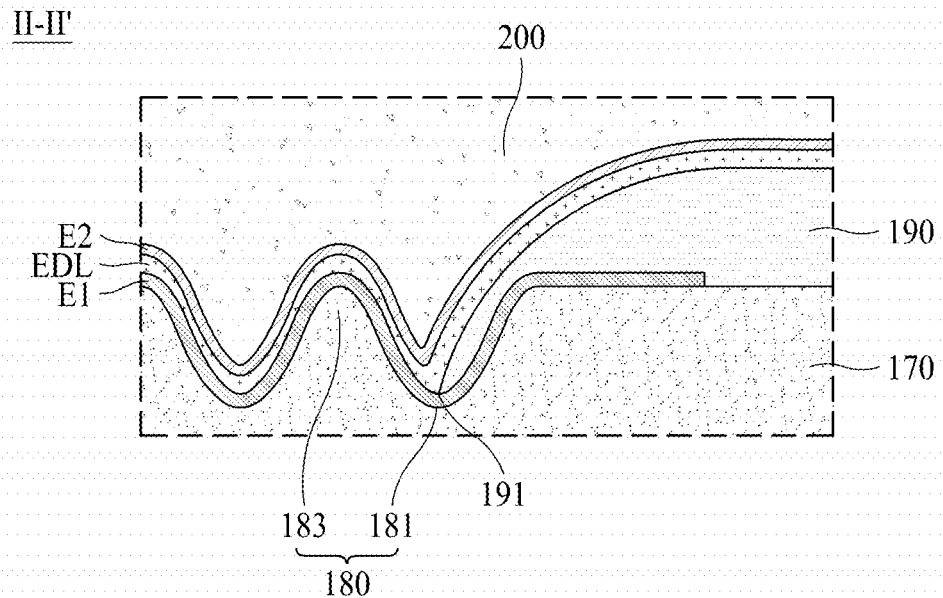
FIG. 5B is a cross-sectional view along II-II' of FIG. 4.

Referring to FIGS. 5A and 5B, the end 191 of the bank layer 190 may be positioned at the concave portion 181 of the outermost light extraction pattern 180 so that the protruding portion 183 of the outermost light extraction pattern 180 may be exposed without being covered by (or overlaid with) the bank layer 190. At this time, the end 191 of the bank layer 190 may be disposed to expose an inclined surface between the outermost concave portion 181 and the protruding portion 183 facing the light emission area EA.

When the end 191 of the bank layer 190 is disposed to be positioned in the concave portion 181 of the outermost light extraction pattern 180, the light emission area EA may be widened to increase an aperture ratio, thereby improving a luminance. When the end 191 of the bank layer 190 is disposed to be positioned at the concave portion 181 of the outermost light extraction pattern 180, the light emission area EA may be maximally widened, thereby increasing an aperture ratio and increasing a luminance.

Figure 5C:
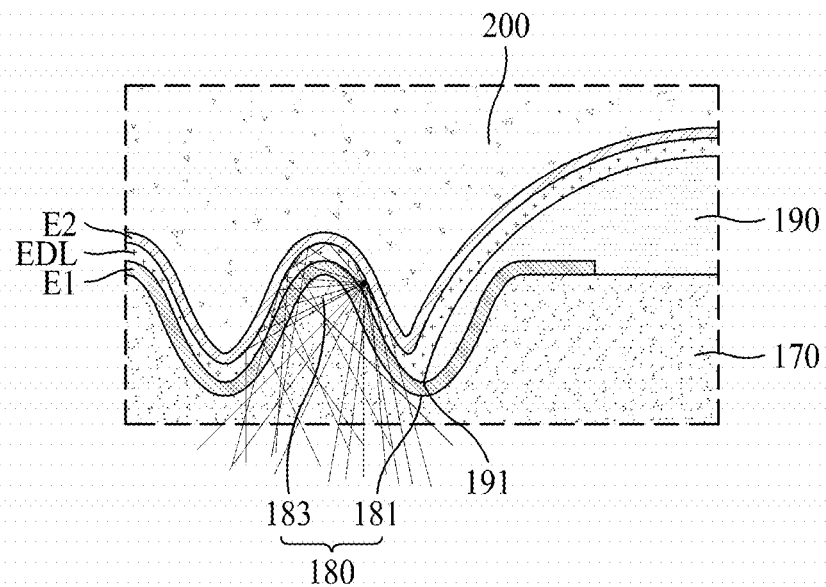
FIG. 5C is a view configured to explain a light extraction efficiency of FIGS. 5A and 5B.

When the end 191 of the bank layer 190 is disposed to be positioned at the concave portion 181 of the outermost light extraction pattern 180, and the inclined surface between the outermost concave portion 181 and the protruding portion 183 facing the light emission area EA is exposed, as shown in FIG. 5C, the light emitted from the light emitting device layer EDL may be reflected by the second electrode E2 disposed at the inclined surface between the concave portion 181 and the protruding portion 183 without being trapped by the bank layer 190 or the protruding portion 183 of the light extraction pattern 180, and may be extracted forward. When the end 191 of the bank layer 190 is disposed at the concave portion 181 of the outermost light extraction pattern 180, the inclined surface of the light extraction pattern 180 may be exposed, whereby the reflection by the second electrode E2 functioning as a reflection plate may be also increased, thereby increasing a light extraction efficiency.

Figure 6A:
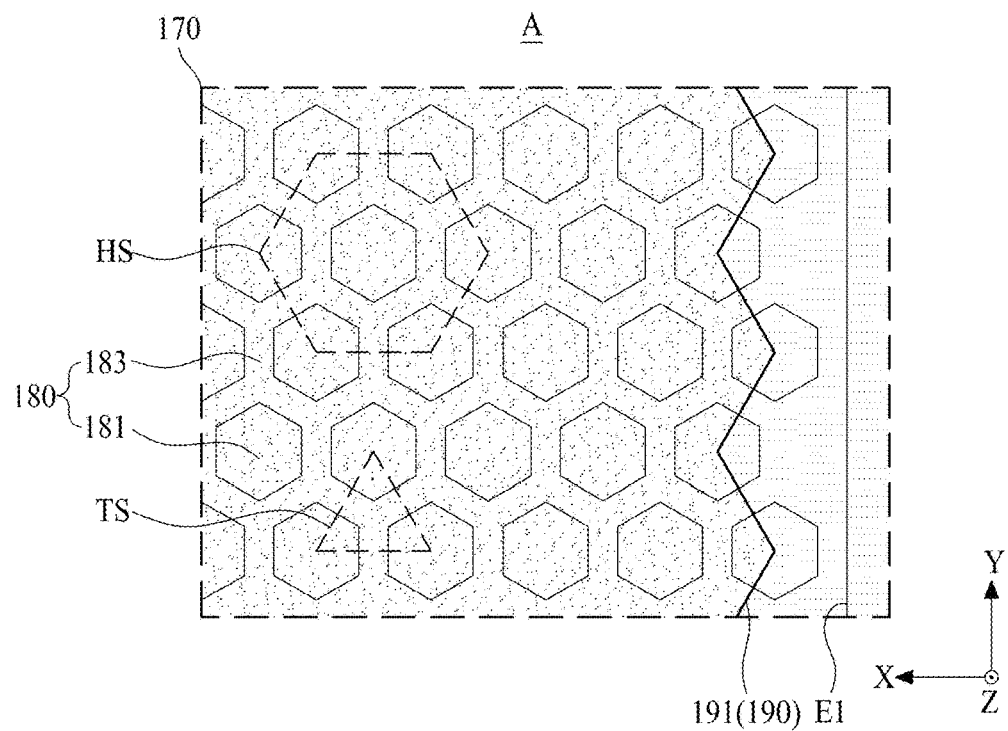
FIGS. 6A and 6B illustrate 'A' portion of FIG. 4 in accordance with other embodiments of the present disclosure.
Figure 6B:
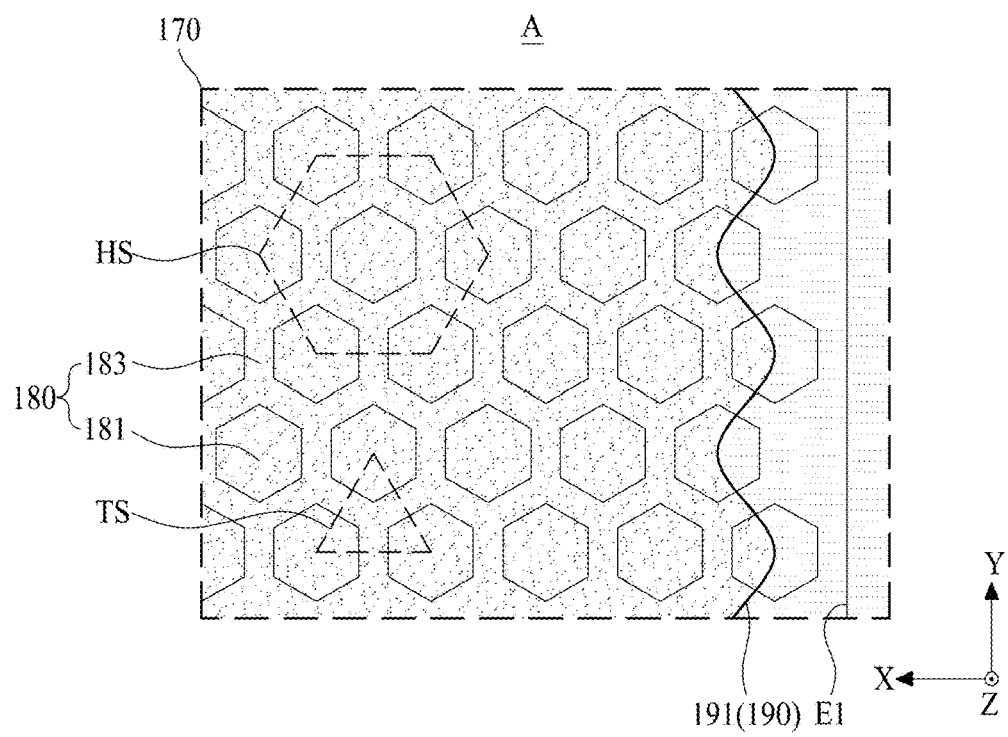

Referring to FIGS. 6A and 6B, the end 191 of the bank layer 190 may be in a form or a wave pattern connected to a diagonal line in a plan view.

In the display apparatus according to the present disclosure, the end 191 of the bank layer 190 is positioned in the concave portion 181 of the outermost light extraction pattern 180 and is disposed to cover (or overlay) the edge of the light extraction pattern 180, thereby increasing the aperture ratio, and thus improving a light emission efficiency. Also, it is possible to reduce the step difference between the first electrode E1 and the bank layer 190, thereby preventing the short (or short-circuit) between the first electrode E1 and the second electrode E2.

In the display apparatus according to the present disclosure, the end 191 of the bank layer 190 is positioned at the concave portion 181 of the outermost light extraction pattern 180 so that it is possible to minimize the light trapped inside and to increase the amount of light reflected by the second electrode E2. Thus, it is possible to maximize the light extraction efficiency of the light extraction pattern 180, thereby improving the efficiency and luminance of the display apparatus.

Figure 7:
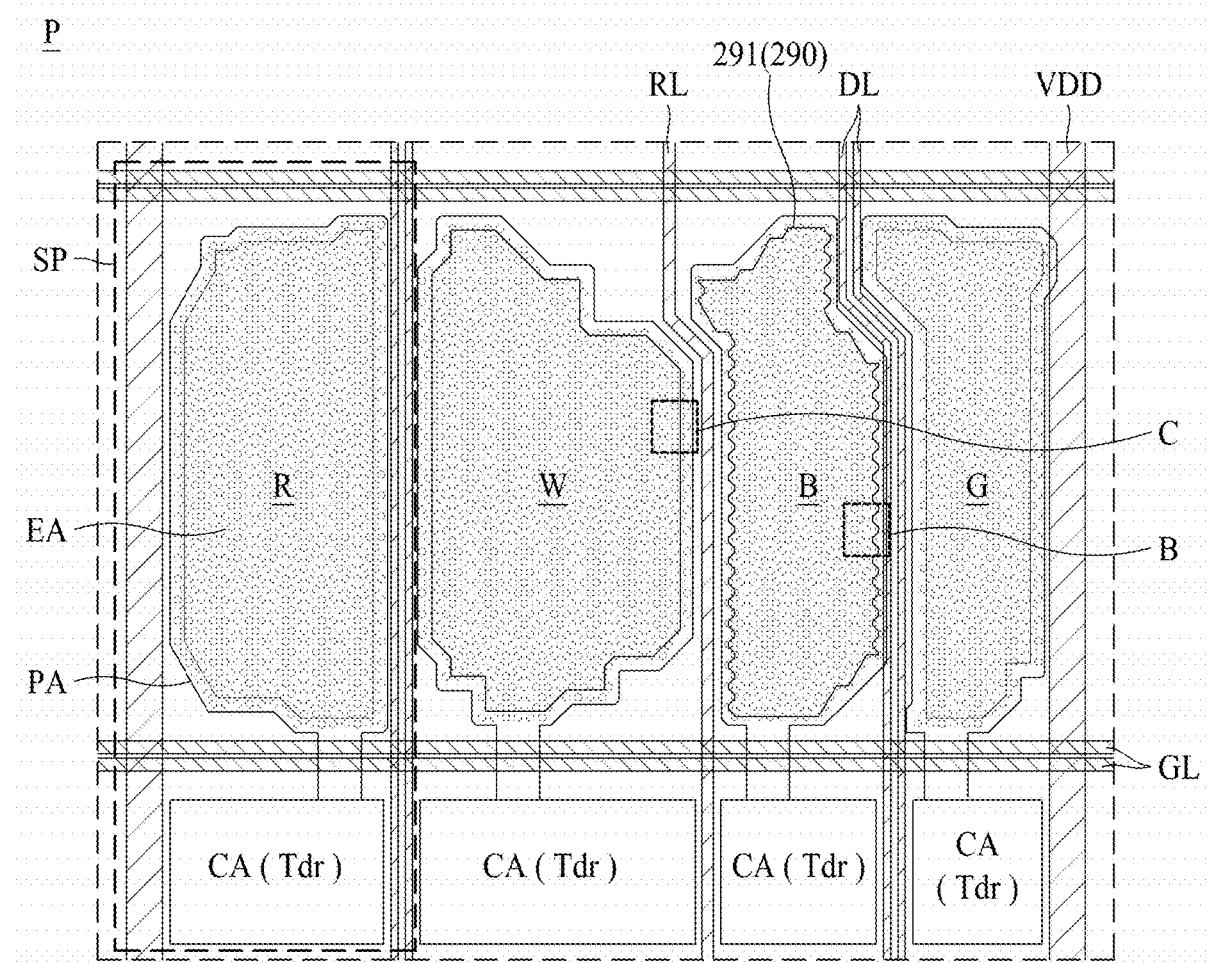
FIG. 7 illustrates a plan structure of a pixel according to the second embodiment of the present disclosure.

FIG. 7 illustrates a plan structure of a pixel according to a second embodiment of the present disclosure.

Referring to FIG. 7, the display apparatus according to another embodiment of the present disclosure may include a plurality of pixels, wherein one unit pixel P may be configured to include a plurality of subpixels SP. One pixel P may include four subpixels SP. One subpixel SP may include a pixel area PA and a circuit area CA. The pixel area PA may include a light emission area EA. The light emission area EA may be an opening area. In the following description, the remaining portions except a bank layer 290 and a light extraction pattern 280 of a planarization layer 270 are the same as described above with reference to FIGS. 1 to 3, and thus their repetitive descriptions may be omitted or will be briefly given.

The light extraction patterns 280 of the planarization layer 270 are disposed inside the pixel area PA of all the subpixels SP. For example, the subpixel SP includes a red subpixel, a white subpixel, a blue subpixel, and a green subpixel. In the display apparatus according to another embodiment of the present disclosure, the end 291 of the bank layer 290 covering (or overlaying) the light extraction pattern 280 disposed in the blue subpixel may be differently disposed from the end 291 of the bank layer 290 covering (or overlaying) the light extraction pattern 280 disposed in the adjacent other pixels. The end 291 of the bank layer 290 may be the outermost bank line, or may be the start point which contacts the first electrode E1, or may be the line of the opening area of the bank layer 190 for defining the light emission area EA.

Figure 8:
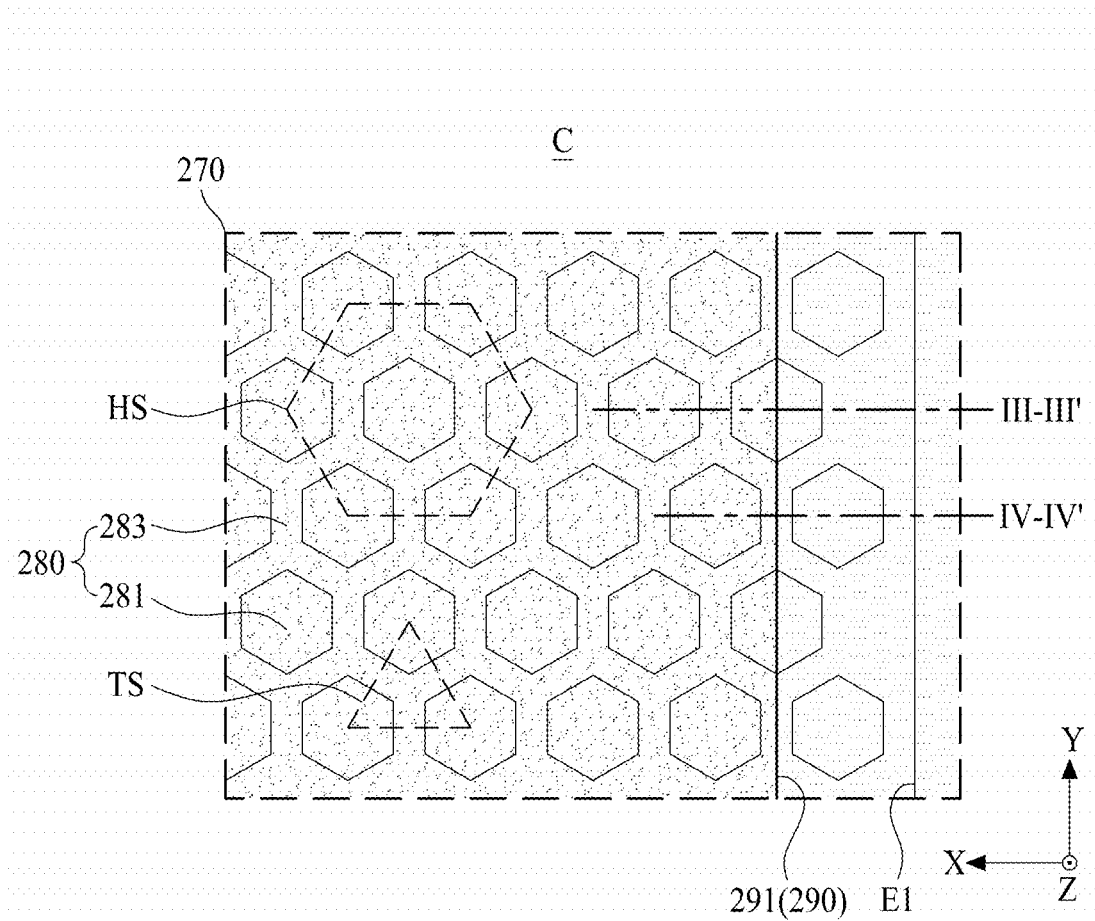
FIG. 8 is an expanded view showing 'C' of FIG. 7.

Referring to FIG. 8, the edge region 'C' of the bank layer 290 of the subpixels SP except for the blue subpixel B, for example, the end 291 of the bank layer 290 in the white subpixel may be disposed at the concave portion 281 of the light extraction pattern 280 in the second direction Y, or may be alternately disposed in the protruding portion 283 of the light extraction pattern 280. The end of the bank layer 290 in the second direction Y may be disposed at the concave portion 281 of the light extraction pattern 280 disposed in one row (X direction) and may be disposed at the protruding portion 283 of the light extraction pattern 280 disposed in the next row (X direction) of the aforementioned one row.

The bank layer 290 may be disposed at an upper surface of the planarization layer 270 to cover (or overlay) the edge of the first electrode E1 extending onto the circuit area CA, and may be disposed to cover (or overlay) the edge of the light extraction pattern 280. The light emission area EA defined by the bank layer 290 may be formed to have a smaller size than the light extraction pattern 280 of the planarization layer 270 in a plan view.

Figure 9A:
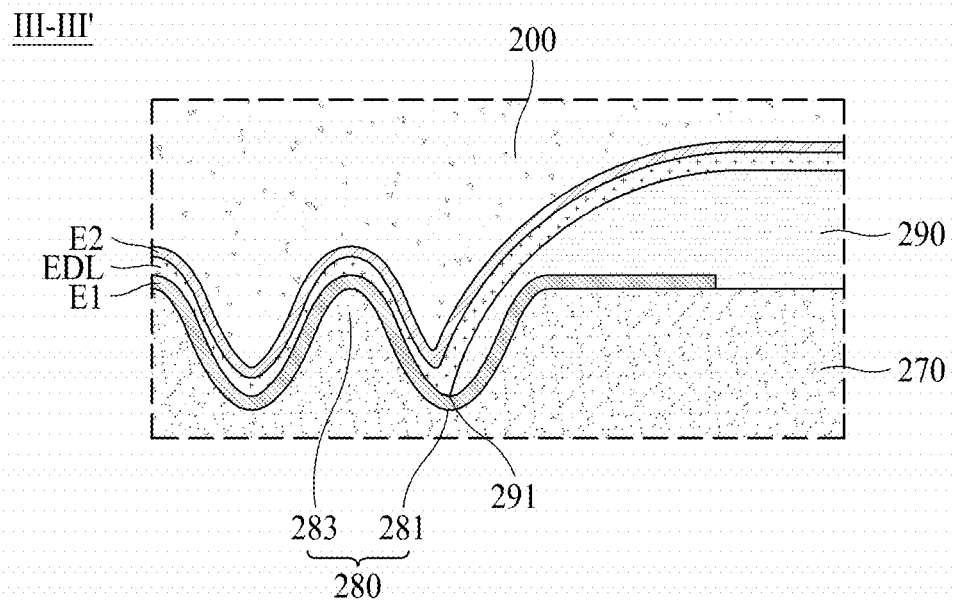
FIG. 9A is a cross-sectional view along III-III' of FIG. 8.
Figure 9B:
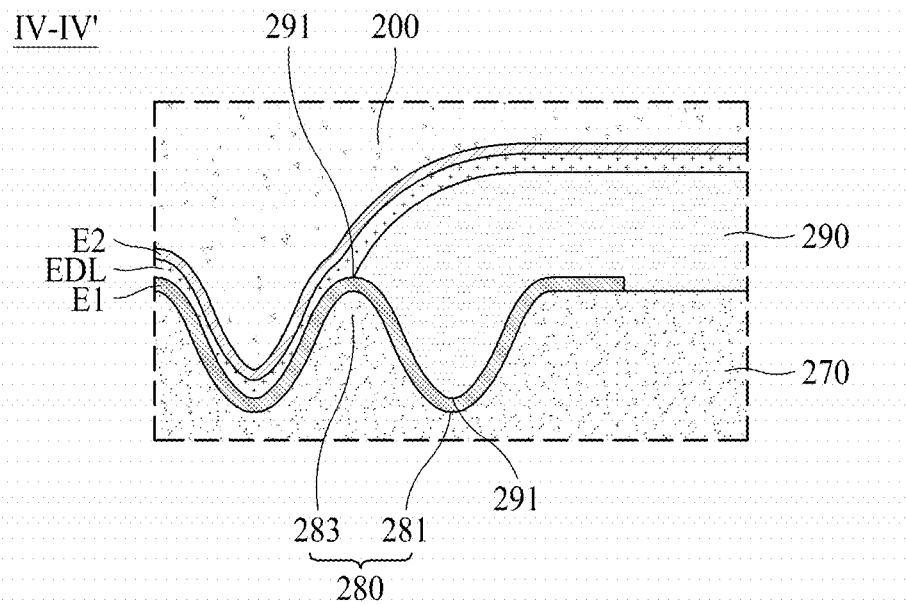
FIG. 9B is a cross-sectional view along IV-IV' of FIG. 8.

Referring to FIGS. 9A and 9B, the end 291 of the bank layer 290 of the remaining pixels except for the blue subpixel B may be positioned at the concave portion 281 or the protruding portion 283.

The light emitting device layer EDL may be formed at the first electrode E1, the bank layer 190, and a step-difference portion between the first electrode E1 and the bank layer 190. In this case, when the light emitting device layer EDL is provided at a thin thickness at the step-difference portion between the first electrode E1 and the bank layer 190, the second electrode E2 and the first electrode E1 may electrically contact (or short-circuit) to each other due to a thickness reduction of the light emitting device layer EDL. In order to prevent this problem, the end 291 of the bank layer 290 is disposed to cover (or overlay) the edge of the light extraction pattern 280 so that it is possible to reduce a step difference between the first electrode E1 and the bank layer 290, to thereby prevent a short (or short-circuit) between the first electrode E1 and the second electrode E2.

Figure 10:
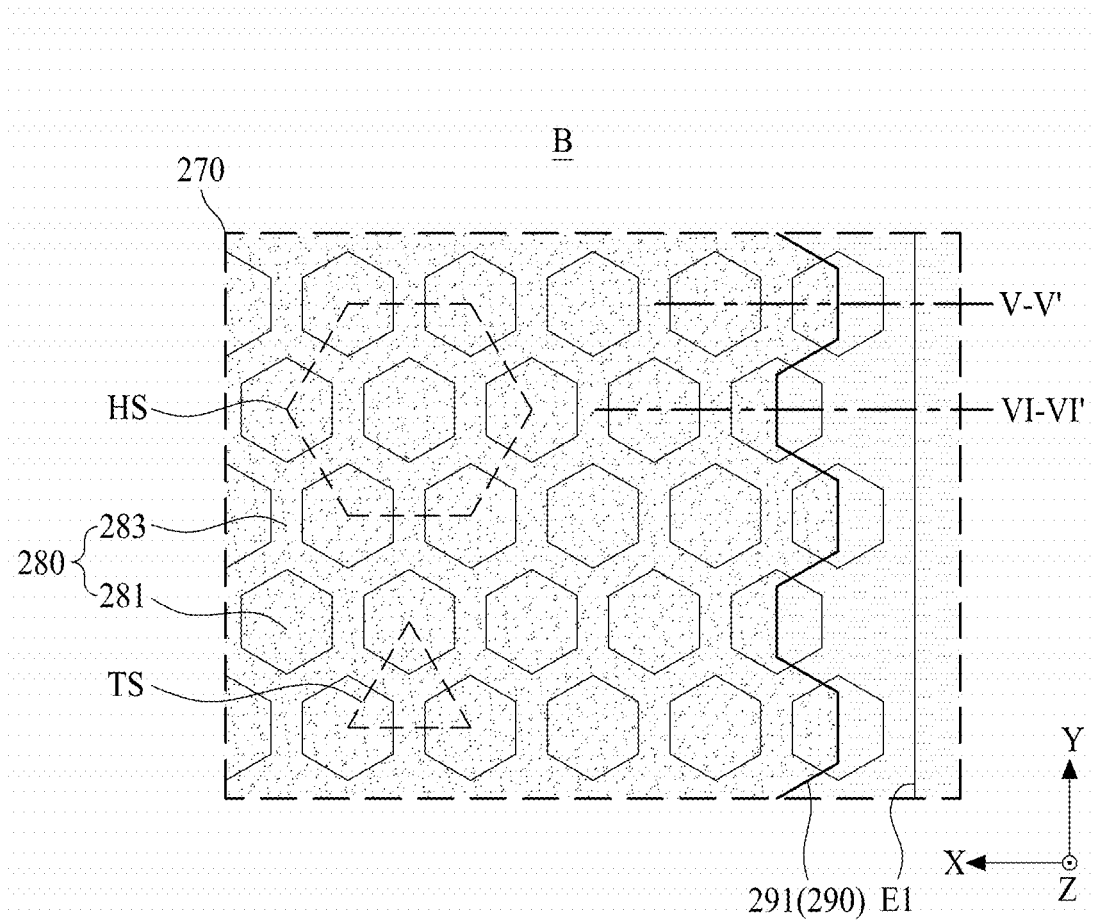
FIG. 10 is an expanded view showing 'B' of FIG. 7.

Referring to FIG. 10, the light extraction pattern 280 of the blue subpixel B may include the plurality of concave portions 281, and the protruding portion 283 between the plurality of concave portions 281.

Each of the plurality of concave portions 281 may be concavely provided from an upper surface of the planarization layer 170 to face the substrate 100 with respect to the flat surface of the planarization layer 270. Each of the plurality of concave portions 281 may have the same depth with respect to the upper surface of the planarization layer 270. However, when a patterning process of the light extraction pattern 280 is performed, some of the plurality of concave portions 281 may be configured to have different depths or (different heights).

The plurality of concave portions 281 may be arranged at fixed intervals in parallel along the first direction X, and may be arranged in a zigzag shape along the second direction Y. For example, the plurality of concave portions 281 may be arranged in a lattice shape having a predetermined interval, and may be staggered with respect to each other along the second direction Y. Therefore, when the adjacent concave portions 281 arranged along the first direction X are connected to each other, the adjacent concave portions 281 may be connected to each other in a straight line. However, when the adjacent concave portions 281 arranged along the second direction Y may be connected to each other, the adjacent concave portions 281 may be connected to each other in a zigzag line Z. For example, the straight line or zigzag line Z may pass through the center of the adjacent concave portions 281.

The center of each of the three adjacent concave portions 281 may form a triangle shape TS. Also, each of the plurality of concave portions 281 may be surrounded by the adjacently disposed six concave portions 281. In this case, the center of each of the six concave portions 281 surrounding one concave portion 281 may form a hexagonal shape HS in a two-dimensional structure. For example, the plurality of concave portions 281 may be disposed or arranged in a beehive, or honeycomb structure, or a circle structure.

The protruding portion 283 may be provided over the planarization layer 270 overlapped with the light emission area EA to have a shape capable of maximizing an external extraction efficiency of light generated in the subpixel SP based on an effective light light emission area of the light emitting portion EP. The protruding portion 283 may increase external extraction efficiency of light emitted from the light emitting portion EP by changing the progress path of the light emitted from the light emitting portion EP toward the substrate 100.

The protruding portion 283 may be implemented to individually surround each of the plurality of concave portions 281. For example, the protruding portion 283 may include a bottom surface (or bottom surface) of each of the plurality of concave portions 181, and an inclined surface inclined from the bottom surface to all directions. Accordingly, the planarization layer 270 overlapped with the light emission area EA may include the plurality of concave portions 281 surrounded by the protruding portion 283. The protruding portion 283 surrounding one concave portion 181 may have a hexagonal shape (or honeycomb shape) in a two-dimensional structure.

The bank layer 290 in the blue subpixel may be disposed at the edge of the first electrode E1 and the planarization layer 270. The bank layer 290 may be formed of an organic material such as belzocyclobutene (BCB) based resin, acrylic based resin, or polyimide resin. The bank layer 290 may be formed of a photosensitizer including a black pigment. In this case, the bank layer 290 may also function as a light shielding member between the adjacent pixels.

The bank layer 290 is disposed at the upper surface of the planarization layer 270 to cover (or overlay) the edge of the first electrode E1 extending onto the circuit area CA, and is disposed to cover (or overlay) the edge of the light extraction pattern 280. The light emission area EA defined by the bank layer 290 may be formed to have a smaller size than the light extraction pattern 280 of the planarization layer 270.

The end 291 of the bank layer 290 in the blue subpixel B is disposed at the concave portion 281 of the light extraction pattern 280 disposed in one row (X direction) along the second direction Y, and is disposed at the concave portion 281 of the light extraction pattern 280 disposed in the next row (X direction) of the aforementioned one row.

Figure 11A:
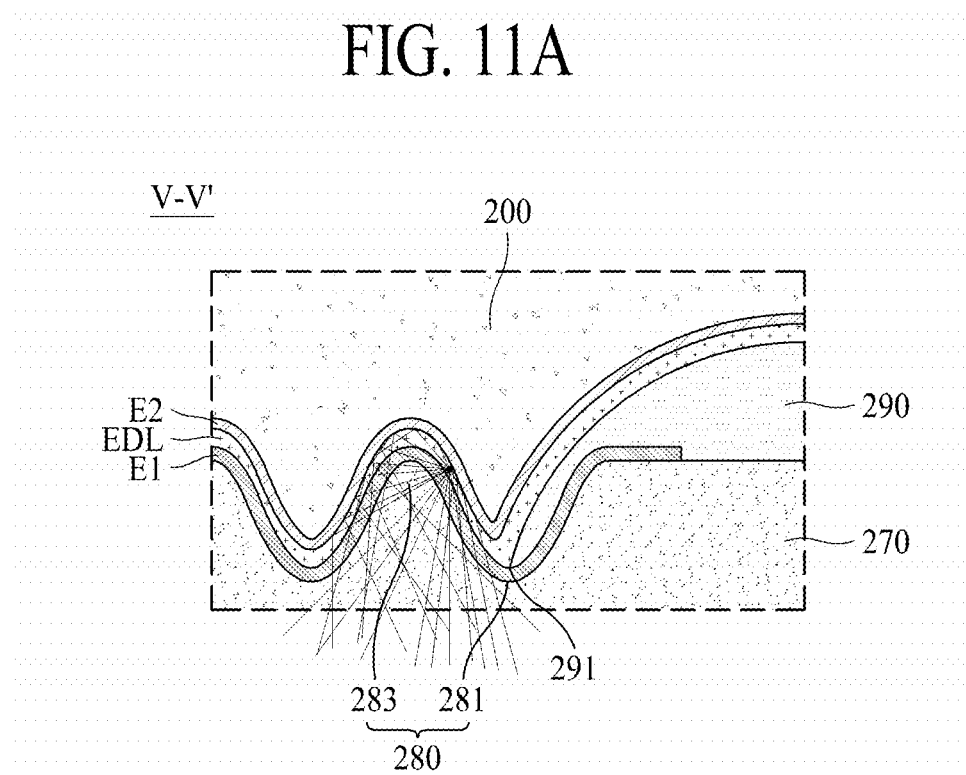
FIG. 11A is a cross-sectional view along V-V' of FIG. 10.
Figure 11B:
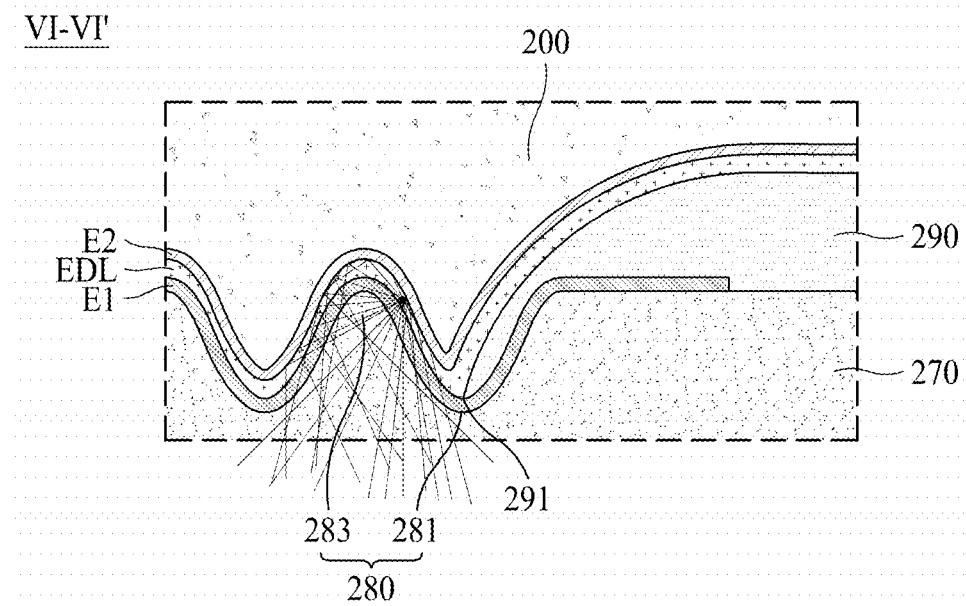
FIG. 11B is a cross-sectional view along VI-VI' of FIG. 10.

Referring to FIGS. 11A and 11B, the end 291 of the bank layer 290 opening the light emission area EA in the blue subpixel B may be positioned inside the first electrode E1 in which the light extraction pattern 280 is disposed with respect to the edge of the first electrode E1, and may be positioned on the concave portion 281 of the outermost light extraction pattern 280. The end 291 of the bank layer 290 in the blue subpixel B may has a zigzag shape in a plan view. The end 291 of the bank layer 290 in the blue subpixel B may be a wave pattern form in a plan view. The end 291 of the bank layer 290 in the blue subpixel B may be disposed to be overlapped with all the concave portions 281 of the outermost light extraction pattern 280 disposed inside the at least one subpixel SP.

The end 291 of the bank layer 290 in the blue subpixel B may be positioned at the concave portion 281 of the outermost light extraction pattern 280 so that the protruding portion 283 of the outermost light extraction pattern 280 may be exposed without being covered by (or overlaid with) the bank layer 290. At this time, the end 291 of the bank layer 290 may be disposed to expose an inclined surface between the outermost concave portion 281 in the blue subpixel B and the protruding portion 283 of the blue subpixel B facing the light emission area EA. When the end 291 of the bank layer 290 may be disposed to be positioned in the concave portion 281 of all the outermost light extraction pattern 280 of the blue subpixel B or may be disposed in a zigzag shape, the light emission area EA in the blue subpixel B may be widened at maximum to increase an aperture ratio of the blue subpixel B, thereby improving a luminance.

In general, when the aperture ratio of the blue subpixel B whose efficiency is relatively lower than those of the other pixels is increased, a light emission efficiency of the blue subpixel B may be increased. According as the end 291 of the bank layer 290 of the blue subpixel B is positioned in the concave portion 281 of the outermost light extraction pattern 280, a color temperature can be improved.

The light emitting device layer EDL may be formed at the first electrode E1, the bank layer 290, and a step-difference portion between the first electrode E1 and the bank layer 290. In this case, when the light emitting device layer EDL is provided at a thin thickness at the step-difference portion between the first electrode E1 and the bank layer 290, the second electrode E2 and the first electrode E1 may electrically contact (or short-circuit) to each other due to a thickness reduction of the light emitting device layer EDL. In order to prevent this problem, the outermost bank line corresponding to one end 191 of the bank layer 290 is disposed to cover (or overlay) the edge of the light extraction pattern 280 so that it is possible to reduce a step difference between the first electrode E1 and the bank layer 290, to thereby prevent a short (or short-circuit) between the first electrode E1 and the second electrode E2.

In the display apparatus according to another embodiment of the present disclosure, the end 291 of the bank layer 290 is disposed at the concave portion 281 of the outermost light extraction pattern 280 in the remaining pixels except the blue subpixel B, for example, the red subpixel R, the green subpixel G, and the white subpixel W, or the end 291 of the bank layer 290 is alternately disposed in the protruding portion 283 of the light extraction pattern 280. And, the end 291 of the bank layer 290 in the blue subpixel B is disposed at the concave portion 281 of the outermost light extraction pattern 280, and the inclined surface of the outermost light extraction pattern 280 in the blue subpixel B is exposed, whereby the reflection by the second electrode E2 functioning as a reflection plate may be increased, thereby increasing an efficiency and a luminance in the blue subpixel B.

Figure 12:
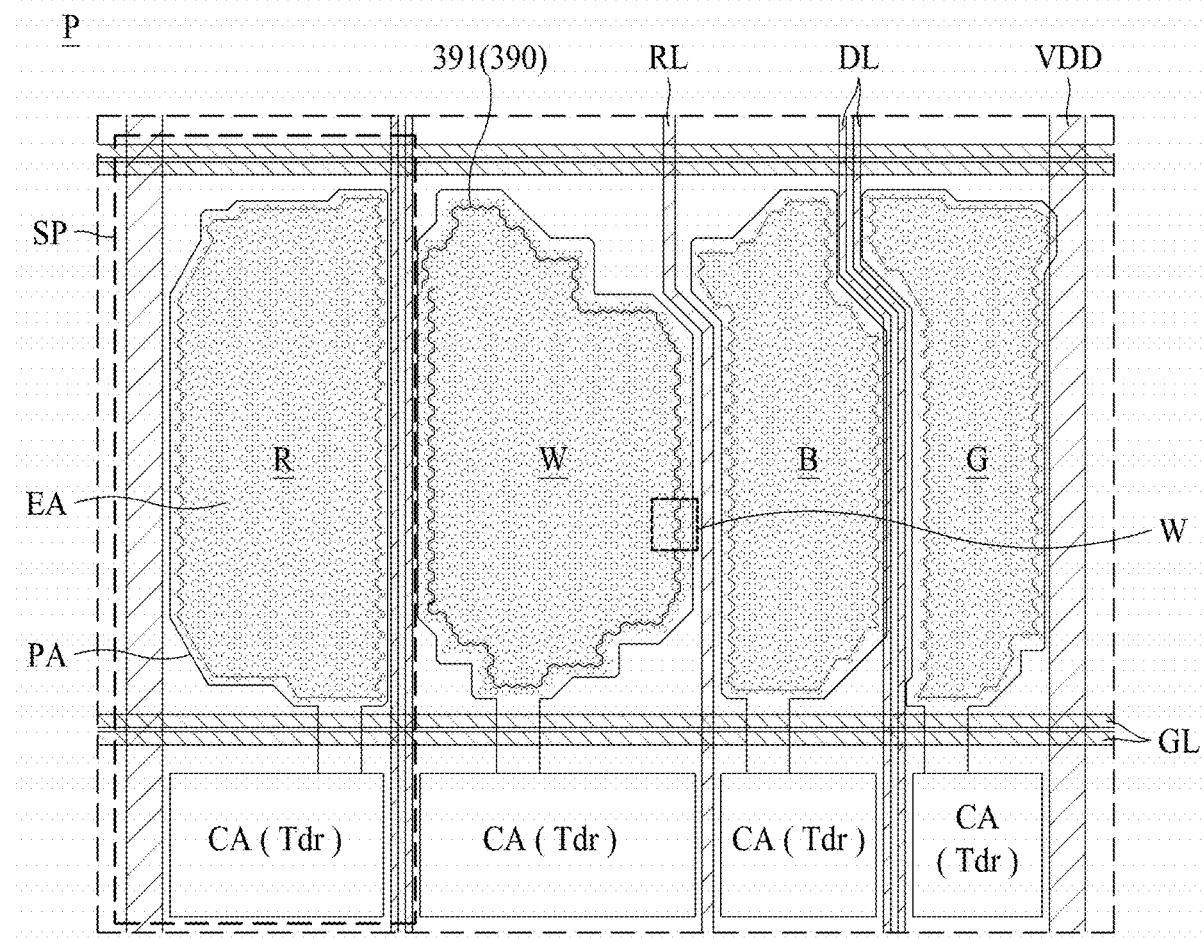
FIG. 12 illustrates a plan structure of a pixel according to the third embodiment of the present disclosure.

FIG. 12 illustrates a plan structure of a pixel P according to the third embodiment of the present disclosure.

The display apparatus according to the third embodiment of the present disclosure may include a plurality of pixels P, wherein one unit pixel P may be configured to include a plurality of subpixels SP. One pixel P may include four subpixels SP. One subpixel SP may include a pixel area PA and a circuit area CA. The pixel area PA may include a light emission area EA. The light emission area EA may be an opening area. In the following description, the remaining portions except a bank layer 390 and a light extraction pattern 380 of a planarization layer 370 are the same as described above with reference to FIGS. 1 to 3, and thus their repetitive descriptions may be omitted or will be briefly given.

The light extraction patterns 380 are disposed in the planarization layer 370 of the pixel area PA of all the subpixels SP. For example, the subpixel SP includes a red subpixel R, a white subpixel W, a blue subpixel B, and a green subpixel G. In the display apparatus according to the third embodiment of the present disclosure, the end 391 of the bank layer 390 covering (or overlaying) the light extraction pattern 380 disposed in the white subpixel W may be differently disposed from the end 391 of the bank layer 390 covering (or overlaying) the light extraction pattern 380 disposed in the adjacent other pixels, for example, the red, green, and blue subpixels.

The end 391 of the bank layer 390 may be the outermost bank line, or may be the start point which contacts the first electrode E1, or may be the line of the opening area of the bank layer 390 for defining the light emission area EA.

As in the embodiment of the present disclosure described above with reference to FIGS. 1 to 6, the end 391 of the bank layer 390 in each of the red subpixel R, the blue subpixel B, and the green subpixel G may be disposed at the concave portion 381 of the outermost light extraction pattern 380, and the inclined surface of the outermost light extraction pattern 380 may be exposed without being covered by (or overlaid with) the bank layer 390.

When the end 391 of the bank layer 390 in each of the red subpixel R, the blue subpixel B, and the green subpixel G is disposed at the concave portion 381 of the outermost light extraction pattern 380, the light emission area EA may be widened, and the aperture ratio is increased so that the inclined surface of the light extraction pattern 380 may be exposed. Thus, the reflection by the second electrode E2 functioning as a reflection plate may be also increased, thereby increasing a light extraction efficiency.

When the end 391 of the bank layer 390 in each of the red subpixel R, the blue subpixel B, and the green subpixel G is disposed at the concave portion 381 of all the outermost light extraction pattern 380, the light emission area EA may be widened at maximum, and the aperture ratio may be increased at maximum so that all the inclined surface of the light extraction pattern 380 may be exposed. Thus, the reflection by the second electrode E2 functioning as a reflection plate may be maximized, thereby maximizing a light extraction efficiency.

The end 391 of the bank layer 390 in each of the red subpixel R, the blue subpixel B, and the green subpixel G may be a non-straight line shape, a zigzag shape, or a wave pattern shape in a plan view.

Figure 13:
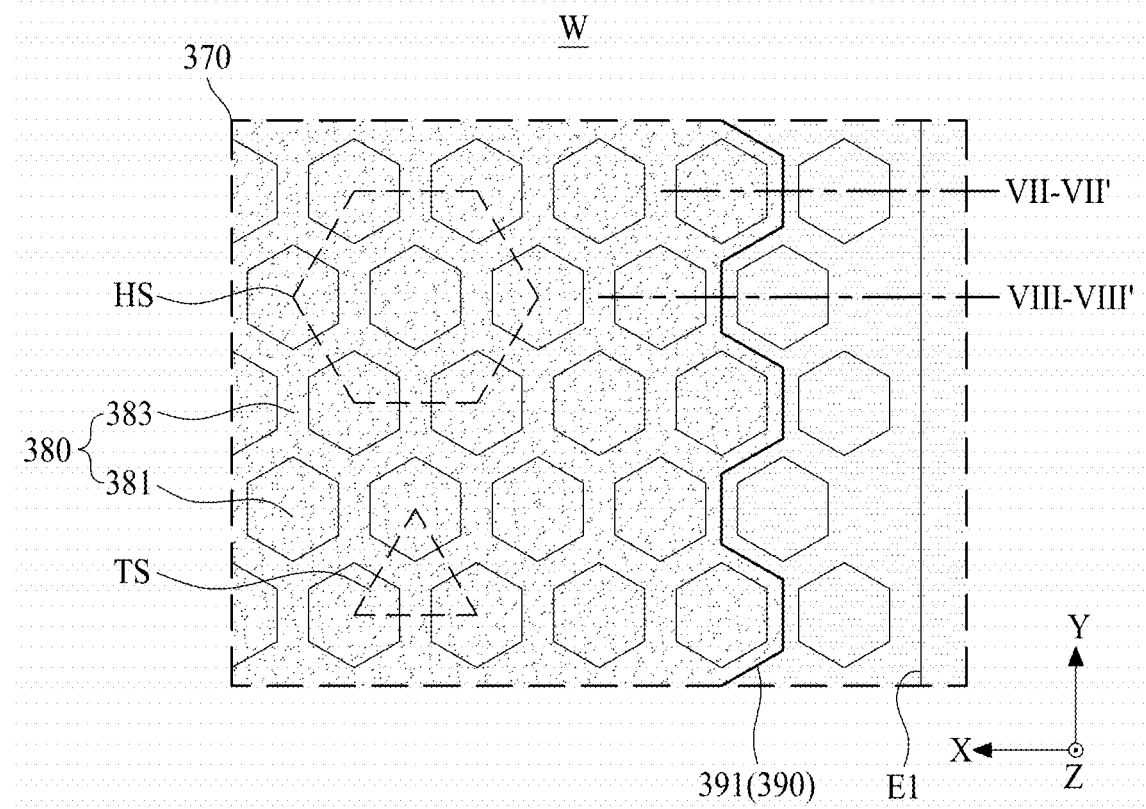
FIG. 13 is an expanded view showing 'W' of FIG. 12.

Referring to FIG. 13, the end 391 of the bank layer 390 in the white subpixel W may be positioned inside the first electrode E1 with respect to the edge of the first electrode E1, and may be positioned at the protruding portion 383 of the outermost light extraction pattern 380. The end 391 of the bank layer 390 in the white subpixel W may have a zigzag shape in a plan view. The end 391 of the bank layer 390 in the white subpixel W may have a wave pattern shape in a plan view. The end 391 of the bank layer 390 in the white subpixel W may be disposed to be overlapped with all the protruding portion 383 of the outermost light extraction pattern 380 disposed inside the subpixel SP.

The plurality of concave portions 381 of the light extraction pattern 380 in the white subpixel W may be disposed at fixed intervals in parallel along the first direction X, and may be disposed in a zigzag shape along the second direction Y. For example, the plurality of concave portions 381 may be arranged in a lattice shape having a predetermined interval, and the concave portions 381 adjacent along the second direction Y are staggered with respect to each other. The center of each of the three adjacent concave portions 381 may form a triangle shape TS. Also, each of the plurality of concave portions 381 may be surrounded by the adjacently disposed six concave portions 381. In this case, the center of each of the six concave portions 381 surrounding one concave portion 381 may be disposed to make a hexagonal shape HS in a two-dimensional structure. For example, the plurality of concave portions 381 may be disposed or arranged to make a beehive or honeycomb structure or a circle structure.

The protruding portion 383 may be provided over the planarization layer 370 overlapped with the light emission area EA to have a shape capable of maximizing an external extraction efficiency of light generated in the subpixel SP based on an effective light emission area of the light emitting portion EP. The protruding portion 383 may increase external extraction efficiency of light emitted from the light emitting portion EP by changing the progress path of the light emitted from the light emitting portion EP toward the substrate 100.

The protruding portion 383 may be implemented to individually surround each of the plurality of concave portions 381. For example, the protruding portion 383 may include a bottom surface (or bottom surface) of each of the plurality of concave portions 381, and an inclined surface inclined from the bottom surface to all directions. Accordingly, the planarization layer 370 overlapped with the light emission area EA may include the plurality of concave portions 381 surrounded by the protruding portion 383. The protruding portion 383 surrounding one concave portion 381 may have a hexagonal shape (or honeycomb shape) in a two-dimensional structure.

The end 391 of the bank layer 390 in the white subpixel W may be disposed every between the concave portion 381 of the outermost light extraction pattern 380 and the concave portion 381 of the light extraction pattern 380 disposed at the previous therein. The end 391 of the bank layer 390 in the white subpixel W may be disposed to overlap all the protruding portions 383 of the outermost light extraction pattern 380.

Figure 14A:
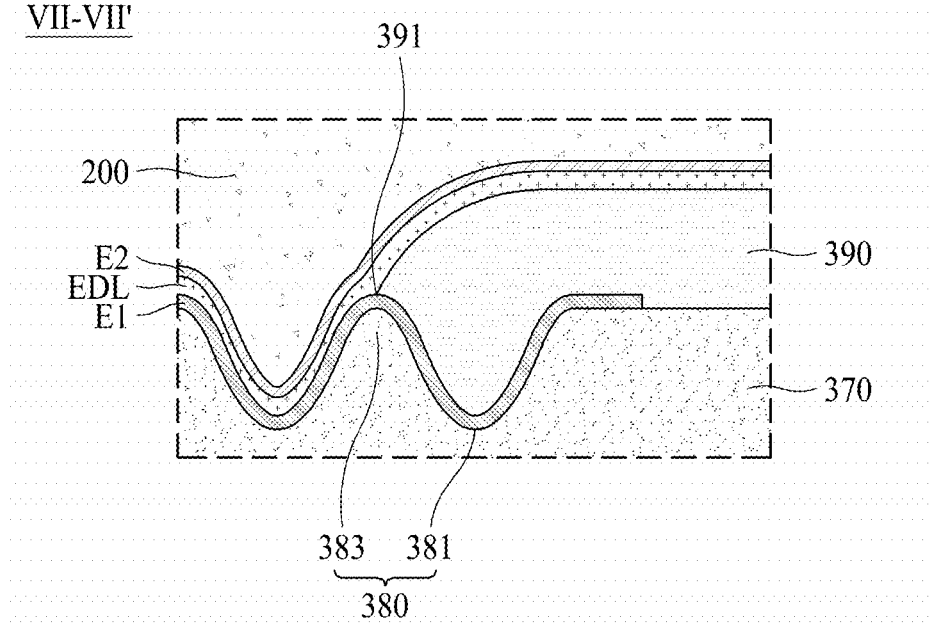
FIG. 14A is a cross-sectional view along VII-VII' of FIG. 13.
Figure 14B:
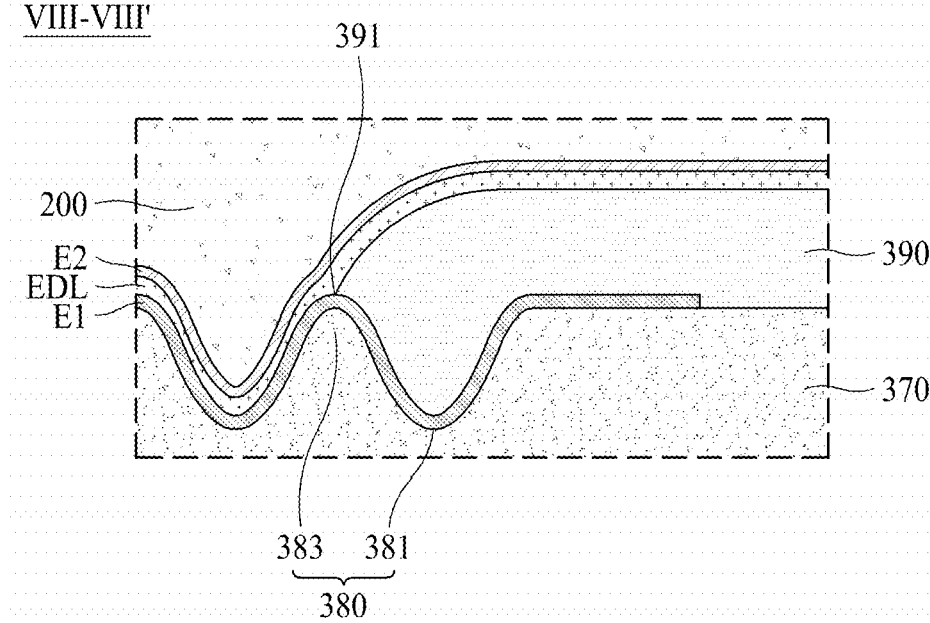
FIG. 14B is a cross-sectional view along VIII-VIII' of FIG. 13.

Referring to FIGS. 14A and 14B, according as the end 391 of the bank layer 390 of the white subpixel W is disposed at the protruding portion 383 of the outermost light extraction pattern 380, the protruding portion 383 of the outermost light extraction pattern 380 may be covered by (or overlaid with) the bank layer 390. At this time, the end 391 of the bank layer 390 may be disposed to cover (or overlay) the inclined surface between the outermost concave portion 381 and the protruding portion 383 facing the light emission area EA. The end 391 of the bank layer 390 in the white subpixel W may be disposed at each of the protruding portions 383 of all the outermost light extraction pattern 380. The end 391 of the bank layer 390 in the white subpixel W may be disposed between the outermost light extraction pattern 380 and the previous outermost light extraction pattern 380. For example, the end 391 of the bank layer 390 in the white subpixel W may be disposed between the outermost light extraction pattern 380 and the light extraction pattern 380 adjacent to the outermost light extraction pattern 380.

When the end 391 of the bank layer 390 in the white subpixel W is disposed at every protruding portion 383 between the outermost light extraction pattern 380 and the previous light extraction pattern 380 or disposed every between the concave portion 381 of the outermost light extraction pattern 380 and the concave portion 381 of the light extraction pattern 380 disposed at the previous therein, the reflection visibility of the display apparatus can be lowered by reducing the diffusion components of light.

The display apparatus according to the present disclosure can adjust the light extraction efficiency by adjusting the position of the end of the bank layer and the light extraction pattern for each subpixel SP having different color temperatures.

The above-described feature, structure, and effect of the present disclosure are included in at least an embodiment of the present disclosure, but are not limited to only an embodiment. Furthermore, the feature, structure, and effect described in at least an embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:
1. A display apparatus comprising:
  a plurality of subpixels configured to include a light emission area;
  a planarization layer configured to include a plurality of light extraction patterns having a plurality of concave portions and a plurality of protruding portions in each of the plurality of subpixels;
  a light emitting device layer disposed at the planarization layer of each of the plurality of subpixels; and
  a bank layer disposed between the planarization layer and the light emitting device layer to open the light emission area in each of the plurality of subpixels, wherein an end of the bank layer is configured to be disposed at the concave portion of an outermost light extraction pattern of at least one of the plurality of subpixels, wherein the concave portions adjacent along a first direction among the plurality of concave portions are connected to each other in a straight line, and the concave portions adjacent along a second direction crossing to the first direction among the plurality of concave portions are connected by a zigzag line.

2. The display apparatus according to claim 1, wherein the end of the bank layer is disposed to be overlapped with all the concave portions of all the outermost light extraction patterns among the plurality of light extraction patterns.

3. The display apparatus according to claim 1, wherein the plurality of subpixels are configured to include a red subpixel, a white subpixel, a blue subpixel, and a green subpixel, wherein the end of the bank layer is disposed at the concave portion of the outermost light extraction pattern in each of the red subpixel, the white subpixel, the blue subpixel, and the green subpixel.

4. The display apparatus according to claim 1, wherein the plurality of subpixels are configured to include a red subpixel, a white subpixel, a blue subpixel, and a green subpixel, wherein the end of the bank layer is alternately disposed at the concave portion and the protruding portion of the outermost light extraction pattern in each of the red subpixel, the white subpixel, and the green subpixel, and the end of the bank layer in the blue subpixel is disposed at the concave portion of the outermost light extraction pattern.

5. The display apparatus according to claim 4, wherein:

the plurality of light extraction patterns are arranged in parallel along a first direction, and are staggered in a second direction crossing to the first direction, and, in each of the red subpixel, the blue subpixel, and the green subpixel, the end of the bank layer disposed in one row with respect to the second direction is disposed at the concave portion of the outermost light extraction pattern, and the end of the bank layer disposed in the next row of the one row is disposed at the protruding portion of the outermost light extraction pattern.

6. The display apparatus according to claim 4, wherein:

the plurality of light extraction patterns are arranged in parallel along a first direction, and are staggered in a second direction crossing to the first direction, and, in the blue subpixel, the end of the bank layer disposed in one row with respect to the second direction is disposed at the concave portion of the outermost light extraction pattern, and the end of the bank layer disposed in the next row of the one row is disposed at the concave portion of the outermost light extraction pattern.

7. The display apparatus according to claim 1, wherein:

the plurality of subpixels are configured to include a red subpixel, a white subpixel, a blue subpixel, and a green subpixel, in each of the red subpixel, the blue subpixel, and the green subpixel, the end of the bank layer is disposed at the concave portion of the outermost light extraction pattern, and the end of the bank layer in the white subpixel is disposed at the protruding portion of the outermost light extraction pattern.

8. The display apparatus according to claim 7, wherein the end of the bank layer in the white subpixel is disposed to be overlapped with all the protruding portions of the outermost light extraction pattern.

9. The display apparatus according to claim 1, wherein the plurality of subpixels are configured to include a red subpixel, a white subpixel, a blue subpixel, and a green subpixel, and the end of the bank layer in the white subpixel is disposed between the outermost light extraction pattern and another light extraction pattern adjacent to the outermost light extraction pattern.

10. The display apparatus according to claim 1, wherein the end of the bank layer is configured to have a non-straight line shape, a zigzag shape, or a wave pattern shape.

11. The display apparatus according to claim 1, further comprising:

a substrate configured to include the plurality of subpixels;

a pixel circuit portion disposed at the substrate;

a protection layer disposed at the pixel circuit portion; and a wavelength conversion layer disposed between the substrate and the planarization layer to overlap with the light emission area.

12. The display apparatus according to claim 1, further comprising:

a first electrode disposed at the planarization layer of each of the plurality of subpixels and formed of a transparent conductive material; and a second electrode disposed at the light emitting device layer and formed of an opaque conductive material with high reflectivity.

* * * * *